United States Patent
Ding

(10) Patent No.: US 11,780,338 B2
(45) Date of Patent: Oct. 10, 2023

(54) TIME DELAY TOLL SYSTEM FOR CHARGING PILES AND ITS METHOD

(71) Applicant: Beijing X-Charge Co., Ltd., Beijing (CN)

(72) Inventor: Rui Ding, Beijing (CN)

(73) Assignee: Beijing X-Charge Co., Ltd., Beijing (CN)

(*) Notice: Subject to any disclaimer, the term of this patent is extended or adjusted under 35 U.S.C. 154(b) by 42 days.

(21) Appl. No.: 15/607,635

(22) Filed: May 29, 2017

(65) Prior Publication Data

US 2018/0050596 A1  Feb. 22, 2018

(30) Foreign Application Priority Data

Aug. 19, 2016  (CN) .......................... 201610694707.6

(51) Int. Cl.
*B60L 53/10* (2019.01)
*B60L 53/64* (2019.01)
(Continued)

(52) U.S. Cl.
CPC .............. *B60L 53/11* (2019.02); *B60L 53/64* (2019.02); *G01R 31/58* (2020.01); *G07B 15/02* (2013.01);
(Continued)

(58) Field of Classification Search
CPC ...... B60L 11/185; G07B 15/02; G01R 31/021
(Continued)

(56) References Cited

U.S. PATENT DOCUMENTS 5,202,617 A * 4/1993 Nor ........................... B60L 3/12
320/109
9,669,719 B1 * 6/2017 Gerber ...................... H02J 7/04

FOREIGN PATENT DOCUMENTS

EP  2711876 A1 * 3/2014 ............. G06Q 10/02

* cited by examiner

*Primary Examiner* — Eric D Lee
(74) *Attorney, Agent, or Firm* — HOUTTEMAN LAW LLC

(57) ABSTRACT

Invention enclosed herein discloses a time delay toll system for charging piles, which can promote an electric automobile user to leave as early as possible and/or settle accounts as quick as possible after the charging is completed, improve the availability factor of the charging piles and parking stalls, and thereby increasing an efficiency of operation of the charging piles. The time delay toll system comprising: a charging state inspection module, which is configured to detect a magnitude of each communication cable of a plurality of communication cables installed in the charging piles, and send the magnitude of the voltage to a microprocessor; a parking detection module, which is installed on a parking stall, and is configured to detect whether there is an automobile on said parking stall; a microprocessor, which is configured to determine whether the charging of said automobile is competed according to a magnitude of a voltage of a communication cable associated with said automobile, if said charging is completed, notify a timer to reckon by time to generate time elapse data associated with said charging, which is a time period from said automobile driving in the parking stall for charging to leaving the parking stall when the charging is completed; and a fee deduction module, which is configured to calculate a charge expense and a time delay expense, and to deduct the said charge expense and said time delay expense from a user fund previously established for an owner of said electric automobile. A method (Continued)

that adopts this time delay toll system for charging piles is also disclosed.

6 Claims, 2 Drawing Sheets

(51) Int. Cl.
    *G01R 31/58*     (2020.01)
    *H02J 7/00*     (2006.01)
    *G07B 15/02*     (2011.01)

(52) U.S. Cl.
    CPC ....... *H02J 7/00032* (2020.01); *B60L 2240/80* (2013.01); *B60L 2250/12* (2013.01); *H02J 2310/48* (2020.01); *Y02T 10/70* (2013.01); *Y02T 10/7072* (2013.01); *Y02T 90/12* (2013.01); *Y02T 90/14* (2013.01); *Y02T 90/16* (2013.01); *Y02T 90/167* (2013.01); *Y04S 30/14* (2013.01)

(58) Field of Classification Search
    USPC .......................................................... 320/109
    See application file for complete search history.

TIME DELAY TOLL SYSTEM FOR CHARGING PILES AND ITS METHOD

FIELD OF THE INVENTION

The present invention relates to a technical field of new energy vehicles, and particularly relates to a time delay toll system for charging piles, and a method that adopts this system.

BACKGROUND OF THE INVENTION

With the development of the technology and the science, due to the energy saving and environmental protection of the new energy vehicles, new energy vehicles are more and more popular in common people. Therefore, in the current parking lot, more and more charging piles are used.

However, the current charging piles are often faced with such a problem: the user is still occupied for a long time and do not leave after charging is end. This condition greatly hindered the use of the other customers, and resulted in a waste of charging parking spaces and charging piles.

SUMMARY OF THE INVENTION

For the above technical problem, the present invention provides a time delay toll system for charging piles, which can promote the electric automobile user to leave as early as possible or settle accounts as early as possible after his charging is end, and can improve the availability factor of charging piles and parking stalls, and can increase the efficiency of operation of charging piles.

The technical solution of the present invention is, the system includes:

the charging state inspection module, which is configured to detect the magnitude of voltage of the communication cables of charging piles, and send the magnitude of voltage to the microprocessor;

the parking detection module, which is installed on the parking stall, and is configured to detect whether has an automobile on this parking stall;

the microprocessor, which is configured to determine whether the charging is end according to the magnitude of voltage, if yes, then notify the timer to reckon by time, and send the module of deducting fees the time that the automobile stayed from the beginning to leaving:

the module of deducting fees, which is configured to calculate charge expense and time delay expense, and is configured to deduct the said charge expense and time delay expense from the user's fund.

The present invention also provides a method that adopts this time delay toll system for charging piles, wherein the said charging pile is AC charging pile, and including the following steps:
 (1) Starting charging, the said magnitude of voltage is 6V;
 (2) When charging is end, and when the said magnitude of voltage is 9V or 6V, perform the step (3), otherwise perform the step (5);
 (3) the timer begins to reckon by time, and gets the time that the automobile stayed from the time beginning to the car's leaving;
 (4) calculating charge expense and time delay expense;
 (5) the said magnitude of voltage is 12V;
 (6) deducting the said charge expense and time delay expense from the user's fund.

Or the present invention also provides a method that adopts this time delay toll system for charging piles, wherein the said charging pile is DC charging pile, including the following steps.
 (I) Starting charging, the said magnitude of voltage is 4V;
 (II) When charging is end, and when the said magnitude of voltage is 4V, perform the step (III), otherwise perform the step (V),
 (III) the timer begins to reckon by time, and gets the time that the automobile stayed from the time beginning to the car's leaving;
 (IV) calculating charge expense and time delay expense;
 (V) the said magnitude of voltage is 6V;
 (VI) deducting the said charge expense and time delay expense from the user's fund.

By the judgment for the connection status of hardware and flexible toll mechanism, through the economic lever means, the present invention can promote the electric vehicle users to leave as soon as possible after their charging is end, make the charging piles and the parking spaces to the next users, improve the efficiency of the use of parking and charging piles, and increase the operation efficiency of charging piles.

DETAILED DESCRIPTION OF THE PREFERRED EMBODIMENTS

Figure 1:
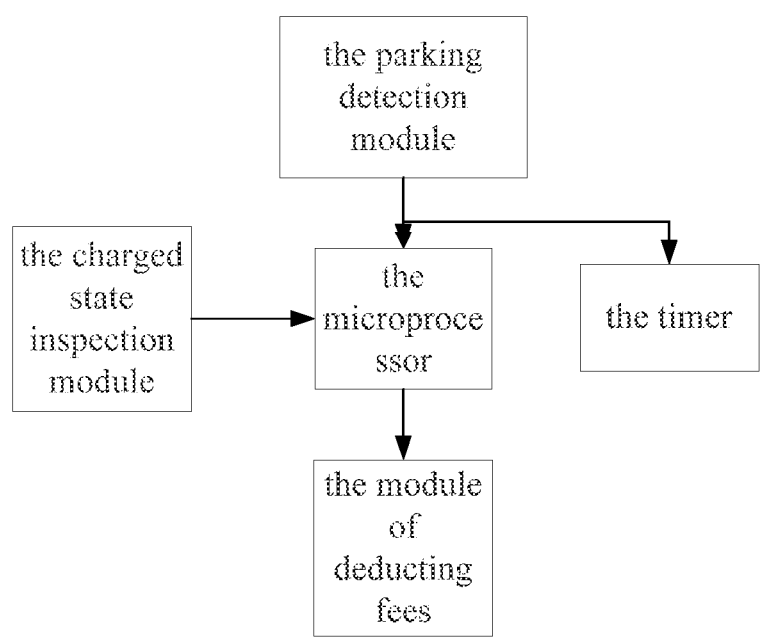
FIG. 1 is a schematic view of the time delay toll system for charging piles according to the present invention.

As shown as FIG. 1, this time delay toll system for charging piles, the system includes:

the charging state inspection module, which is configured to detect the magnitude of voltage of the communication cables of the charging piles, and send the magnitude of voltage to the microprocessor;

the parking detection module, which is installed on the parking stall, and is configured to detect whether has an automobile on this parking stall;

the microprocessor, which is configured to determine whether the charging is end according to the magnitude of voltage, if yes, then notify the tinier to reckon by time, and send the module of deducting fees the time that the automobile stayed from the beginning to leaving;

the module of deducting fees, which is configured to calculate charge expense and time delay expense, and is configured to deduct the said charge expense and time delay expense from the user's fund.

By the judgment for the connection status of hardware and flexible toll mechanism, through the economic lever means, the present invention can promote the electric vehicle users to leave as soon as possible after the charging is end, make charging piles and parking spaces to the next users, improve the efficiency of the use of parking and the charging piles, and increase the operation efficiency of charging piles.

Preferably, the system also includes the communication module, which is configured to connect to the microprocessor, when the timer begins to reckon by time, send the time delay expense to the user by the communication module.

Preferably, the said charging pile is AC charging pile, when the said magnitude of voltage is 12V, the microprocessor is confirmed not to connect with a vehicle; when the said magnitude of voltage is 9V or 6V, the microprocessor is confirmed to connect with a vehicle.

Preferably, the said charging pile is DC charging pile, when the said magnitude of voltage is 6V, the microprocessor is confirmed not to connect with a vehicle; when the said magnitude of voltage is 4V, the microprocessor is confirmed to connect with a vehicle.

Figure 2:
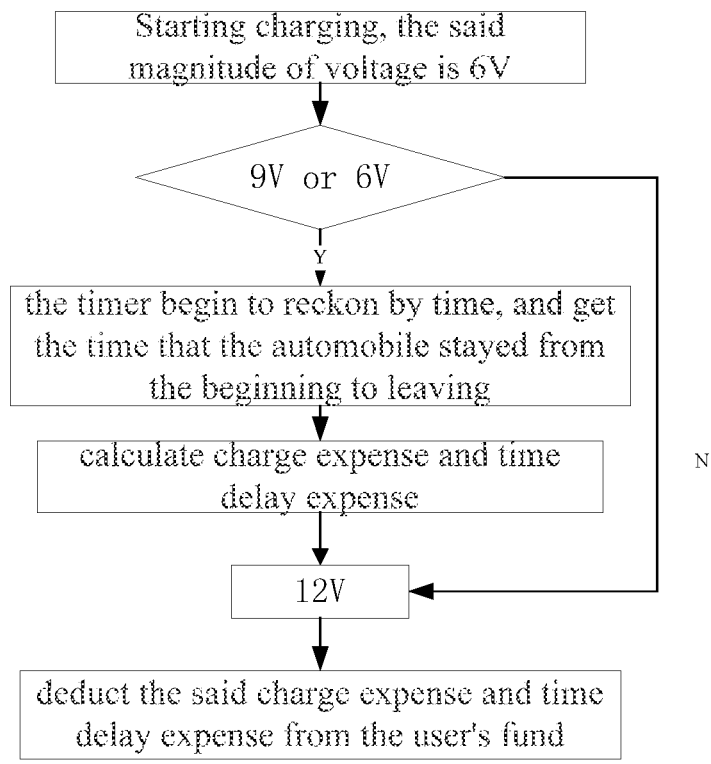
FIG. 2 is a flow chart, showing a method that adopts the time delay toll system for charging piles according to the present invention, wherein the said charging pile is AC charging pile.

As shown as FIG. 2, the present invention also provides a method that adopts this time delay toll system for charging piles, wherein the said charging pile is AC charging pile, including the following steps:

(1) Starting charging, the said magnitude of voltage is 6V;

(2) When the charging is end, and when the said magnitude of voltage is 9V or 6V, perform the step (3), otherwise perform the step (5);

(3) the timer begins to reckon by time, and gets the time that the automobile stayed from the time beginning to the car's leaving;

(4) calculating the charge expense and the time delay expense;

(5) the said magnitude of voltage is 12V;

(6) deducting the said charge expense and time delay expense from the user's fund.

Preferably, the said step (3) also includes a grace time, if a vehicle can leave the parking stall, the time delay expense is zero.

Or the present invention also provides a method that adopts this time delay toll system for charging piles, wherein the said charging pile is DC charging pile, including the following steps.

(I) Starting charging, the said magnitude of voltage is 4V;

(II) When the charging is end, and when the said magnitude of voltage is 4V, perform the step (III), other wise perform the step (V), (III) the timer begins to reckon by time, and gets the time that the automobile stayed from the time beginning to the car's leaving;

(IV) calculating the charge expense and the time delay expense;

(V) the said magnitude of voltage is 6V;

(VI) deducting the said charge expense and time delay expense from the user's fund.

Preferably, the said step (III) also includes a grace time, if a vehicle can leave the parking stall, the time delay expense is zero.

A specific example is given below.

(1) Judge whether a vehicle is connected to a charging pile according to CC, CP.

According to the definition of the AC charging pile CP and DC charging pile CC in the national standard GB/T18487, GB/T20234: the voltage of the AC charging pile CC communication cable is DC 12V voltage at no-load, and the voltage is less than 12V (9V, 6V when inserting the socket) after the vehicle is connected.

the voltage of DC charging pile CP communication cable is DC 6V voltage at no-load, and the voltage is less than 6V (4V when inserting the socket, 6V when pressing the button of the head of charging device) after the vehicle is connected.

(2) As shown as Table 1, the charging pile provides the real-time feedback of the CC and CP voltage status to the internal program and the remote system to determine whether the vehicle is connected. At the same time, according to the following logic to determine whether need to charge the time delay expense.

TABLE 1

| the voltage of AC charging pile CC communication cable | corresponding state | the voltage of DC charging pile CP communication cable | corresponding state |
|---|---|---|---|
| 12 V | don't connect | 6 V don't connect | don't connect to a vehicle |
| 9 V have connected | have connected to a vehicle | 9 V the button is pressed | have connected to the socket, the switch is pressed |
| 6 V have connected | have connected to a vehicle | 4 V have connected | have connected to a vehicle |

(3) When the charging pile hardware judged that the user has finished the charging (fill or manual stop), sends notifications to the user according to "grace time" preset by the software, and requires the user to draw charging device and moves the car in the grace time, at the same time starts the countdown.

(4) When the user cuts off connection (draw charging device) in delay time fee grace time, the system does not charge any delay cost.

(5) When the user stays beyond delay time fee grace time, the system will begin to a new timing or record, and charge according to the system set.

(6) Delay fee setting, can calculate in accordance with the time as a unit, or can single one-time billing.

It is main in the present invention to judge whether this user cuts off connection, that is, whether CP returns to 12V after charging. In other countries except China, it is generally Combo combination, that is, one interface for AC and DC. In DC it also can be determined whether inserting gun or drawing gun by CP definition in AC, as shown as Table 2.

TABLE 2

| | Standard number | | SAE J1772 (Combo) | IEC 62916 (Combo) | GB/T (18487. 1-2015) |
|---|---|---|---|---|---|
| AC charging pile | check the status of voltage by pin | connecting pin | CP | CP | CP |
| | | disconnect (drawing gun) | 12 V ± 1 V | 12 V ± 1 V | 12 ± 0.8 V |
| | | connect but not charge | 9 ± 1 V | 9 V ± 1 V | 9 ± 0.8 V |
| | | start charging (Charging area ventilation not required) | 6 ± 1 V | 6 V ± 1 V | 6 ± 0.8 V |
| | | start charging (Charging area ventilation required) | 3 ± 1 V | 3 V ± 1 V | / |

TABLE 2-continued

| Standard number | SAE J1772 (Combo) | IEC 62916 (Combo) | GB/T (18487. 1-2015) |
|---|---|---|---|
| not drawing gun after charging (Not disconnect connect, but Charging stop) | 6 ± 1 V或9 V ± 1 V | 6 ± 1 V或9 V ± 1 V | 6 V ± 0.8 V或9 ± 0.8 V |

Also, charging piles can obtain the user's vehicle battery information by communication with the vehicle's communication cables (Can, PLC or CCS protocol), and when battery SoC value is arrived set value, notify the user.

According to CC, CP, or other cables that confirm to communicate with a vehicle (each country is different to define the interface, CC: connect confirm, CP: control portion confirm), the charging piles can determine the connection status of the vehicle and the charging piles.

The above stated is only preferable embodiments of the present invention, and it should be noted that the above preferable embodiments do not limit the present invention. The claimed scope of the present invention should be based on that defined by the claims. For a skilled person in this technical field, without departing from spirit and scope of the present invention, any improvement and amendment can be made, and these improvement and amendment should belong to the claimed scope of the present invention.

The invention claimed is:

1. A time delay toll system for charging piles, comprising:
a charging state inspection module, which is configured to, in real-time, detect a magnitude of a voltage of each communication cable of a plurality of communication cables installed in the charging piles, and send information regarding the magnitude of the voltage to a microprocessor;
a parking detection module, which is installed on a parking stall, and is configured to detect whether there is an automobile on said parking stall;
the microprocessor, which is configured to determine whether an electric automobile is being charged and whether the charging of the electric automobile is completed according to the magnitude of the voltage of a communication cable, if the charging is completed, notify a timer to reckon by time to generate time elapse data, which pertain to a time period from the completion of the charging of the electric automobile to a departure of the electric automobile from the parking stall, and send the time elapse data to a fee deduction module;
the fee deduction module, which is configured to calculate a charge expense and a time delay expense, the time delay expense is calculated based on the time elapse data associated with the electric automobile, and to deduct the charge expense and the time delay expense from a user fund previously established for an owner of the electric automobile; and
a communication module, which is configured to interface with the microprocessor to forward information regarding the time delay expense to the owner of the electric automobile when the timer begins generating the time elapse data,
wherein the charging piles are AC (alternating current) charging piles, when the magnitude of the voltage of a communication cable is at 12V, the microprocessor determines that the communication cable is not connected to a vehicle; when the magnitude of the voltage of the communication cable is at 9V or 6V, the microprocessor determines that the communication cable is connected to a vehicle.

2. A method that adopts the time delay toll system for charging piles according to claim 1, the method comprising:
(1) starting the charging when the magnitude of the voltage is at 6V;
(2) when the charging is ended, and when the magnitude of voltage is at 9V or 6V, perform step (3), otherwise perform step (5);
(3) the timer begins reckoning by time, and to generate the time elapse data;
(4) calculating the charge expense and the time delay expense;
(5) the magnitude of voltage is at 12V;
(6) deducting the charge expense and the time delay expense from the user fund.

3. The method according to claim 2, wherein step (3) further applies a grace time in calculating the time delay expense, when a vehicle can leave the parking stall before expiration of the grace time and no charge is imposed on the time delay expense.

4. A time delay toll system for charging piles, comprising:
a charging state inspection module, which is configured to detect a magnitude of a voltage of each communication cable of a plurality of communication cables installed in the charging piles, and send information regarding the magnitude of the voltage to a microprocessor;
a parking detection module, which is installed on a parking stall, and is configured to detect whether there is an automobile on said parking stall;
the microprocessor, which is configured to determine whether an electric automobile is being charged and whether the charging of the electric automobile is completed according to the magnitude of the voltage of a communication cable, if the charging is completed, notify a timer to reckon by time to generate time elapse data, which pertain to a time period from the completion of the charging of the electric automobile to a departure of the electric automobile from the parking stall, and send the time elapse data to a fee deduction module;
the fee deduction module, which is configured to calculate a charge expense and a time delay expense, the time delay expense is calculated based on the time elapse data associated with the electric automobile, and to deduct the charge expense and the time delay expense from a user fund previously established for an owner of the electric automobile; and
a communication module, which is configured to interface with the microprocessor to forward information regarding the time delay expense to the owner of the electric automobile when the timer begins generating the time elapse data,
wherein the charging piles are DC (direct current) charging piles, when the magnitude of the voltage of a communication cable is at 6V, the microprocessor determines that the communication cable is not connected to a vehicle; when the magnitude of the voltage of the communication cable is at 4V, the microprocessor determines that the communication cable is connected to a vehicle.

5. A method that adopts the time delay toll system for charging piles according to claim 4, the method comprising:
(I) starting the charging when the magnitude of the voltage is at 4V;
(II) when the charging is ended, and when the magnitude of the voltage is at 4V, perform step (III), otherwise perform step (V);
(III) the timer begins reckoning by time, to generate the time elapse data;
(IV) calculating the charge expense and time delay expense;
(V) the magnitude of the voltage is at 6V;
(VI) deducting the charge expense and the time delay expense from the user fund.

6. The method according to claim 5, wherein step (III) further applies a grace time in calculating the time delay expense, when a vehicle can leave the parking stall before expiration of the grace time and no charge is imposed on the time delay expense.

\* \* \* \* \*